US010482157B2

(12) United States Patent
Konoshima

(10) Patent No.: US 10,482,157 B2
(45) Date of Patent: Nov. 19, 2019

(54) DATA COMPRESSION APPARATUS AND DATA COMPRESSION METHOD AND STORAGE MEDIUM

(71) Applicant: FUJITSU LIMITED, Kawasaki-shi, Kanagawa (JP)

(72) Inventor: Makiko Konoshima, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/287,540

(22) Filed: Feb. 27, 2019

(65) Prior Publication Data

US 2019/0197084 A1 Jun. 27, 2019

Related U.S. Application Data

(63) Continuation of application No. PCT/JP2017/047073, filed on Dec. 27, 2017.

(30) Foreign Application Priority Data

Jan. 17, 2017 (JP) .................................. 2017-005754

(51) Int. Cl.
*G06F 17/16* (2006.01)
*H03M 7/30* (2006.01)
*G06N 20/00* (2019.01)

(52) U.S. Cl.
CPC .............. *G06F 17/16* (2013.01); *H03M 7/30* (2013.01); *H03M 7/3088* (2013.01); *G06N 20/00* (2019.01)

(58) Field of Classification Search
CPC .............................. H03M 7/30; H03M 7/3088
(Continued)

(56) References Cited

U.S. PATENT DOCUMENTS

| 2013/0300912 A1 | 11/2013 | Tosic et al. |
| 2013/0318020 A1 | 11/2013 | Shapero et al. |
| 2016/0043884 A1 | 2/2016 | Sandell |

FOREIGN PATENT DOCUMENTS

| JP | 2012-173795 | 9/2012 |
| JP | 2013-240054 | 11/2013 |

(Continued)

OTHER PUBLICATIONS

Sakata, A., "Typical Case Analysis of Sample Complexity in Dictionary Learning", IEICE Technical Report, The Institute of Electronics, Information and Communication Engineers, Oct. 2012, vol. 112, No. 279, pp. 113-120.

(Continued)

*Primary Examiner* — Tan V Mai
(74) *Attorney, Agent, or Firm* — Staas & Halsey LLP

(57) ABSTRACT

A data compression apparatus includes a memory; and a processor configured to generate compressed matrix data, compare a threshold and an index value calculated about a specific value data string that is a data string obtained by coupling specific values specified from element values that are not zero values in each row of the compressed matrix data, specify a given constant as respective coefficients when the index value is larger than the threshold, calculate reciprocals of respective specific values as the respective coefficients when the index value is equal to or smaller than the threshold, and output matrix data after operation that is a result of rounding based on the number of places of significant figures of a decimal part in each element that corresponds about products of respective elements of the compressed matrix data and the respective coefficients calculated, regarding the respective elements of the compressed matrix data.

13 Claims, 21 Drawing Sheets

(58) Field of Classification Search
USPC .................................................. 708/520, 203
See application file for complete search history.

(56) References Cited

FOREIGN PATENT DOCUMENTS

| | | |
|---|---|---|
| JP | 2015-220687 | 12/2015 |
| JP | 2016-62249 | 4/2016 |
| JP | 2016-515732 | 5/2016 |

OTHER PUBLICATIONS

International Search Report dated Mar. 27, 2018 in corresponding International Application No. PCT/JP2017/047073.

FIG. 5

| rt (STEP34) | At (STEP36) | i=1 Xti (STEP37) | rt (STEP39) | i=2 SECOND COLUMN IS SIMILAR TO 292nd COLUMN OF A IN ORIENTATION OF VECTOR | | Xti (STEP37) | i=3 THIRD COLUMN IS SIMILAR TO 169th COLUMN OF A IN ORIENTATION OF VECTOR | | Xti (STEP37) |
|---|---|---|---|---|---|---|---|---|---|
| 2.6 | 0.128279876 | 7.652667745 | 1.618316731 | 0.128279876 | 0.085296072 | 7.509094505 | 0.128279876 | 0.085296072 | 7.509095 |
| 2.6 | -0.094491259 | | 3.323110212 | -0.094491259 | -0.007184447 | 6.965821128 | -0.094491259 | -0.007184447 | 6.965821 |
| 2.6 | 0.173789621 | | 1.270045774 | 0.173789621 | 0.041643997 | | 0.173789621 | 0.041643997 | 5.834313 |
| 2.4 | -0.035794966 | | 2.673926978 | -0.035794966 | -0.021573164 | | -0.035794966 | -0.021573164 | |
| 2.7 | -0.138781861 | | 3.762051471 | -0.138781861 | 0.103897993 | | -0.138781861 | 0.103897993 | |
| 2.5 | -0.059144041 | | 2.952609694 | -0.059144041 | -0.038707798 | | -0.059144041 | -0.038707798 | |
| 2.5 | 0.089335362 | | 1.816346158 | 0.089335362 | -0.296293343 | | 0.089335362 | -0.296293343 | |
| 2.6 | 0.100943526 | | 1.827512734 | 0.100943526 | -0.006369857 | | 0.100943526 | -0.006369857 | |
| 2.6 | 0.015317225 | | 2.482782364 | 0.015317225 | -0.030554007 | | 0.015317225 | -0.030554007 | |
| 2.6 | 0.027474569 | | 2.389416148 | 0.027474569 | 0.189264316 | | 0.027474569 | 0.189264316 | |
| 2.4 | 0.060503789 | | 1.936984608 | 0.060503789 | 0.180160113 | | 0.060503789 | 0.180160113 | |
| 2.6 | -0.139479828 | | 3.667039278 | -0.139479828 | -0.044382842 | | -0.139479828 | -0.044382842 | |
| 2.7 | -0.055609626 | | 3.125561199 | -0.055609626 | 0.175488839 | | -0.055609626 | 0.175488839 | |
| 2.7 | -0.174956537 | | 4.038884246 | -0.174956537 | 0.102899993 | | -0.174956537 | 0.102899993 | |
| 2.5 | -0.042932846 | | 2.828550808 | -0.042932846 | 0.093322052 | | -0.042932846 | 0.093322052 | |
| 2.4 | 0.090717685 | | 1.705538116 | 0.090747685 | 0.011399496 | | 0.090747685 | 0.011399496 | |
| 2.5 | 0.068585149 | | 1.975140941 | 0.068585149 | -0.039269941 | | 0.068585149 | -0.039269941 | |
| 2.5 | 0.218709241 | | 0.826290844 | 0.218709241 | -0.067358078 | | 0.218709241 | -0.067358078 | |
| 2.4 | 0.015938642 | | 2.27808687 | 0.015938642 | 0.044299202 | | 0.015938642 | 0.044299202 | |
| 2.5 | -0.206153754 | | 40.77626186 | -0.206153754 | 0.056170976 | | -0.206153754 | 0.056170976 | |

FIG. 6

| A (NO CHANGE IS MADE IN LOOP OF $i_r$, INITIAL VALUES ARE RANDOM NUMBERS) | | | | |
|---|---|---|---|---|
| FIRST COLUMN | 13th COLUMN | ... | 169th COLUMN | 292nd COLUMN |
| 0.04622694 | 0.128279876 | | -0.061009094 | 0.085296072 |
| 0.15767171 | -0.09449126 | | 0.028966094 | -0.007184447 |
| -0.1942086 | 0.173789621 | | 0.01982938 | 0.041643997 |
| 0.07412697 | -0.03579497 | ... | 0.197872673 | -0.021573164 |
| 0.02710644 | -0.13878186 | | -0.153821055 | 0.103897993 |
| -0.112431 | -0.05914404 | | 0.142886426 | -0.038707798 |
| -0.0372789 | 0.089335362 | | 0.140569256 | -0.296293343 |
| 0.02945778 | 0.100943526 | | 0.106983676 | -0.006369857 |
| 0.3076594 | 0.015317225 | | 0.032804158 | -0.030554007 |
| 0.23810755 | 0.027474569 | | 0.100701121 | 0.189264316 |
| -0.1160591 | 0.060503789 | | -0.180743671 | 0.180160113 |
| 0.26093324 | -0.13947983 | | -0.066522184 | -0.044382842 |
| 0.06236799 | -0.05560963 | | 0.108553295 | 0.175488839 |
| -0.0054213 | -0.17495654 | | 0.130954935 | 0.102899993 |
| 0.06145136 | -0.04293285 | | -0.095134039 | 0.093322052 |
| -0.0176223 | 0.090747685 | | 0.073893986 | 0.011399496 |
| -0.0106735 | 0.068585149 | | -0.055446998 | -0.039269941 |
| 0.12807955 | 0.218709241 | | -0.158774135 | -0.067358078 |
| 0.12114439 | 0.015938642 | | 0.163180034 | 0.044299202 |
| 0.1284578 | -0.206153755 | | -0.037746639 | 0.056170976 |

FIG. 9

$$X = \begin{bmatrix} 0 & 0 & 0 & \cdots \\ 0 & 0 & 0 & \cdots \\ 16.1397 & 0 & 0 & \cdots \\ 0 & -2.11269 & 0 & \cdots \\ 0 & 0 & 6.53215 & \cdots \\ 0 & 0 & -2.63519 & \cdots \\ \vdots & \vdots & \vdots & \end{bmatrix}$$

FIG. 10

| Y1 | Y2 |
|---|---|
| 2.6 | 2.5 |
| 2.6 | 2.5 |
| 2.6 | 2.5 |
| 2.4 | 2.5 |
| 2.7 | 2.5 |
| 2.5 | 2.4 |
| 2.5 | 2.4 |
| 2.6 | 2.5 |
| 2.6 | 2.4 |
| 2.6 | 2.4 |
| 2.4 | 2.4 |
| 2.6 | 2.4 |
| 2.7 | 2.5 |
| 2.7 | 2.5 |
| 2.5 | 2.5 |

| X1 | X2 |
|---|---|
| 16.1397 | 15.0513 |
| -3.98809 | -2.11269 |
| 2.69214 | 1.55938 |
| 3.76721 | 1.54149 |
| -1.84536 | 0.761282 |
| 0.18113 | 0.163425 |
| 0.530031 | 0.13557 |
| 7.39294 | 7.36217 |

| Z |
|---|
| 0.0641210 |
| 0.3278269 |
| 0.4704199 |
| 0.3767400 |
| 0.7672706 |
| 5.8045885 |
| 3.0048031 |
| 0.1355462 |

FIG. 12

| Y1 | Y2 |
|---|---|
| 2.6 | 2.5 |
| 2.6 | 2.5 |
| 2.6 | 2.5 |
| 2.4 | 2.5 |
| 2.7 | 2.5 |
| 2.5 | 2.4 |
| 2.5 | 2.4 |
| 2.6 | 2.5 |
| 2.6 | 2.4 |
| 2.6 | 2.4 |
| 2.4 | 2.4 |
| 2.6 | 2.4 |
| 2.7 | 2.5 |
| 2.7 | 2.5 |
| 2.5 | 2.5 |

| X1 | X2 |
|---|---|
| 16.1397 | 15.0513 |
| -3.98809 | -2.11269 |
| 2.69214 | 1.55938 |
| 3.76721 | 1.54149 |
| -1.84536 | 0.761282 |
| 0.18113 | 0.163425 |
| 0.530031 | 0.13557 |
| 7.39294 | 7.36217 |

| Z |
|---|
| 0.0641210 |
| 0.3278269 |
| 0.4704199 |
| 0.3767400 |
| 0.7672706 |
| 5.8045885 |
| 3.0048031 |
| 0.1355462 |

| Xtemp1=X1*Z | Xtemp1=X2*Z |
|---|---|
| 1.0348946 | 0.9651053 |
| -1.3074033 | -0.6925966 |
| 1.2664364 | 0.7335635 |
| 1.4192589 | 0.5807410 |
| -1.4158906 | 0.5841093 |
| 1.051385 | 0.948614 |
| 1.5926388 | 0.4073611 |
| 1.0020853 | 0.9979146 |

FIG. 13

| X1' | X2' |
|---|---|
| 1.035 | 0.965 |
| -1.307 | -0.693 |
| 1.266 | 0.734 |
| 1.419 | 0.581 |
| -1.416 | 0.584 |
| 1.051 | 0.949 |
| 1.593 | 0.407 |
| 1.002 | 0.998 |

FIG. 15

| X1' | X2' |
|---|---|
| 1.03 | 0.97 |
| -1.31 | -0.69 |
| 1.27 | 0.73 |
| 1.42 | 0.58 |
| -1.42 | 0.58 |
| 1.05 | 0.95 |
| 1.59 | 0.41 |
| 1.00 | 1.00 |

FIG. 17

| X1' | X2' |
|---|---|
| 1.035 | 0.965 |
| -1.307 | -0.693 |
| 1.266 | 0.734 |
| 1.419 | 0.581 |
| -1.416 | 0.584 |
| 1.051 | 0.949 |
| 1.593 | 0.407 |
| 1.002 | 0.998 | ized
DATA COMPRESSION APPARATUS AND DATA COMPRESSION METHOD AND STORAGE MEDIUM

CROSS-REFERENCE TO RELATED APPLICATION

This application is a continuation application of International Application PCT/JP2017/047073, filed on Dec. 27, 2017 and designated the U.S., the entire contents of which are incorporated herein by reference. The International Application PCT/JP2017/047073 is based upon and claims the benefit of priority of the prior Japanese Patent Application No. 2017-005754, filed on Jan. 17, 2017, the entire contents of which are incorporated herein by reference.

FIELD

The embodiments discussed herein are related to a data compression apparatus and method and a storage medium.

BACKGROUND

There is an apparatus that reduces the calculation amount for sparse representation classification and carries out the classification at high speed without lowering the classification accuracy (for example, Japanese Laid-open Patent Publication No. 2012-173795).

However, there is a problem that it is difficult to efficiently compress a great deal of data with the existing technology. In the above-described apparatus and so forth, it is desirable that data may be efficiently compressed.

SUMMARY

According to an aspect of the embodiments, a data compression apparatus includes a memory; and a processor coupled to the memory and configured to generate dictionary matrix data used for compression based on matrix data for learning, generate compressed matrix data that is a result of compression of compression-target matrix data and information on positions at which matrix elements are not zero among respective matrix elements of the compressed matrix data based on the compression-target matrix data and the generated dictionary matrix data, compare a threshold and an index value calculated about a specific value data string that is a data string obtained by coupling specific values specified from element values that are not zero values in each row of the generated compressed matrix data, specify a given constant as respective coefficients when the index value is larger than the threshold, calculate reciprocals of respective specific values as the respective coefficients when the index value is equal to or smaller than the threshold, and output, as a compression result, matrix data after operation that is a result of rounding based on the number of places of significant figures of a decimal part in each element that corresponds about products of respective elements of the compressed matrix data and the respective coefficients, regarding the respective elements of the compressed matrix data.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 is an explanatory diagram illustrating a numerical value example of residuals and variables;
FIG. 6 is an explanatory diagram illustrating a numerical value example of dictionary matrix data;
FIG. 9 is an explanatory diagram illustrating a data example of compressed matrix data;
FIG. 10 is an explanatory diagram illustrating a data example of coefficients;
FIG. 12 is an explanatory diagram illustrating a numerical value example;
FIG. 13 is an explanatory diagram illustrating a numerical value example;
FIG. 15 is an explanatory diagram illustrating a numerical value example;
FIG. 17 is an explanatory diagram illustrating a numerical value example.

DESCRIPTION OF EMBODIMENTS

Embodiment 1

Figure 1:
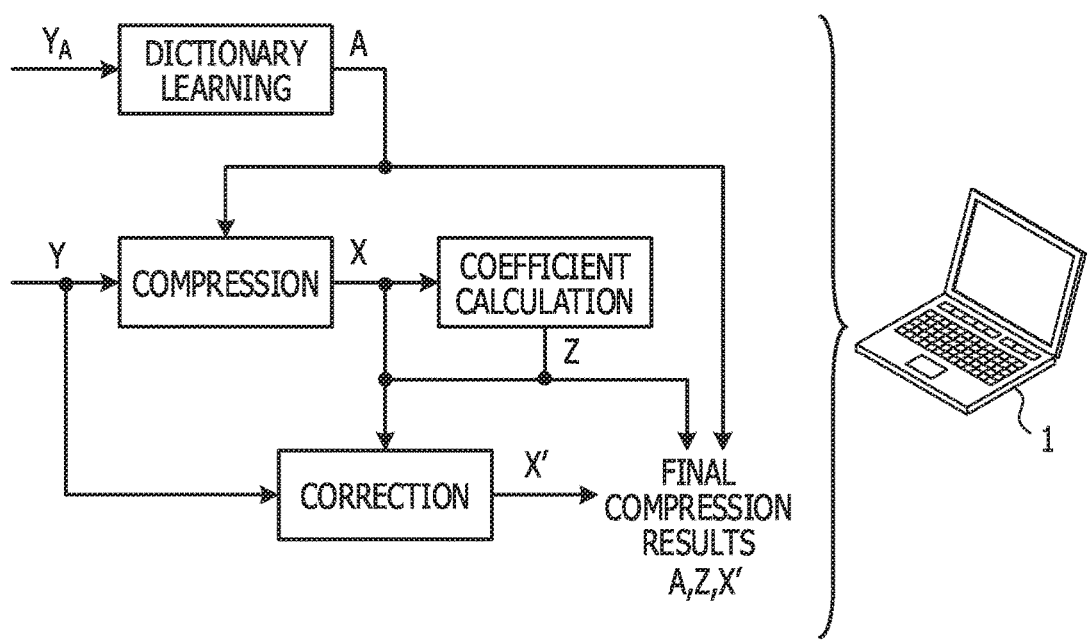
FIG. 1 is an explanatory diagram illustrating outline of processing.

An embodiment will be described below with reference to the drawings. FIG. 1 is an explanatory diagram illustrating outline of processing. An information processing apparatus 1 that executes various kinds of processing, such as calculation of coefficients, is a server computer, personal computer, or the like. In the following, the description will be made with the information processing apparatus 1 read as the computer 1. The computer 1 carries out learning based on matrix data $Y_A$ for learning and generates a dictionary A used for compression. Subsequently, the computer 1 calculates compressed matrix data X by using matrix data Y of a compression target and the dictionary A.

The computer 1 calculates coefficients Z for correcting the compressed matrix data X based on the respective element values of the compressed matrix data X. The computer 1 carries out correction based on the compressed matrix data X and the coefficients Z and then executes fraction processing to thereafter obtain final corrected compressed matrix data X'. The computer 1 outputs the dictionary A, the coefficients Z, and the corrected compressed matrix data X' as final results. Details will be described below.

Figure 2:
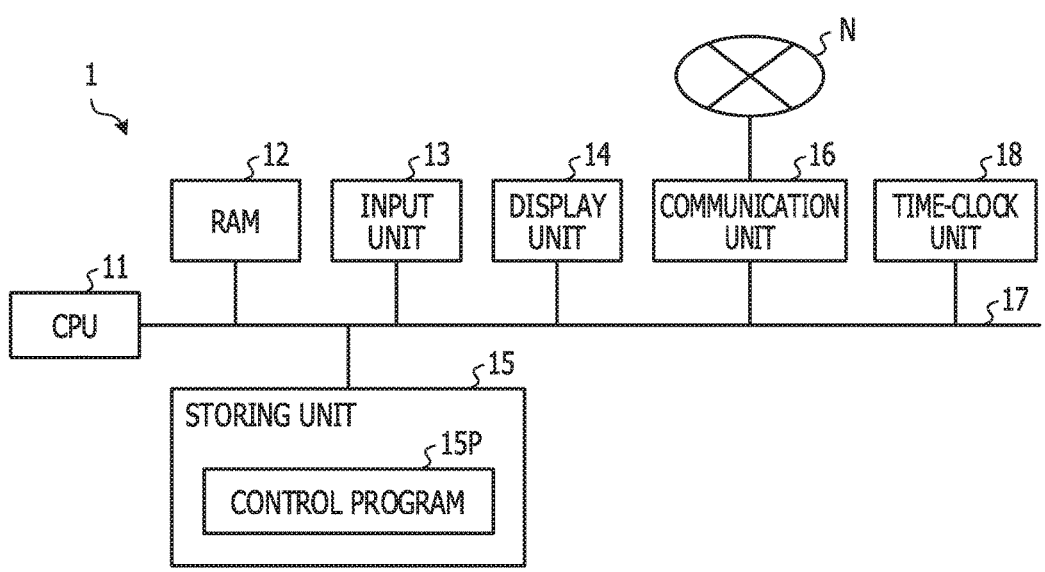
FIG. 2 is a block diagram illustrating a hardware group of a computer.

FIG. 2 is a block diagram illustrating a hardware group of a computer. A computer 1 illustrated in FIG. 2 includes a central processing unit (CPU) 11 as a control unit, a random access memory (RAM) 12, an input unit 13, a display unit 14, a storing unit 15, a time-clock unit 18, a communication unit 16, and so forth. The CPU 11 is coupled to the respective units of hardware through a bus 17. The CPU 11 controls the respective units of hardware in accordance with a control program 15P stored in the storing unit 15. The CPU 11 may be a multi-core processor equipped with plural processor cores. The RAM 12 is a static RAM (SRAM), dynamic RAM (DRAM), flash memory, or the like, for example. The RAM 12 functions also as a storing unit and temporarily stores various pieces of data generated at the time of execution of various kinds of programs by the CPU 11.

The input unit 13 is input devices such as mouse, keyboard, touch panel, and buttons and outputs accepted operation information to the CPU 11. The display unit 14 is a liquid crystal display, organic electro luminescence (EL) display, or the like and displays various kinds of information in accordance with an instruction of the CPU 11. The communication unit 16 is a communication module and carries out transmission and reception of information with another computer (not illustrated) or the like. The time-clock unit 18 outputs date-and-time information to the CPU 11. The storing unit 15 is a high-capacity memory or hard disk and stores the control program 15P and so forth.

Figure 3:
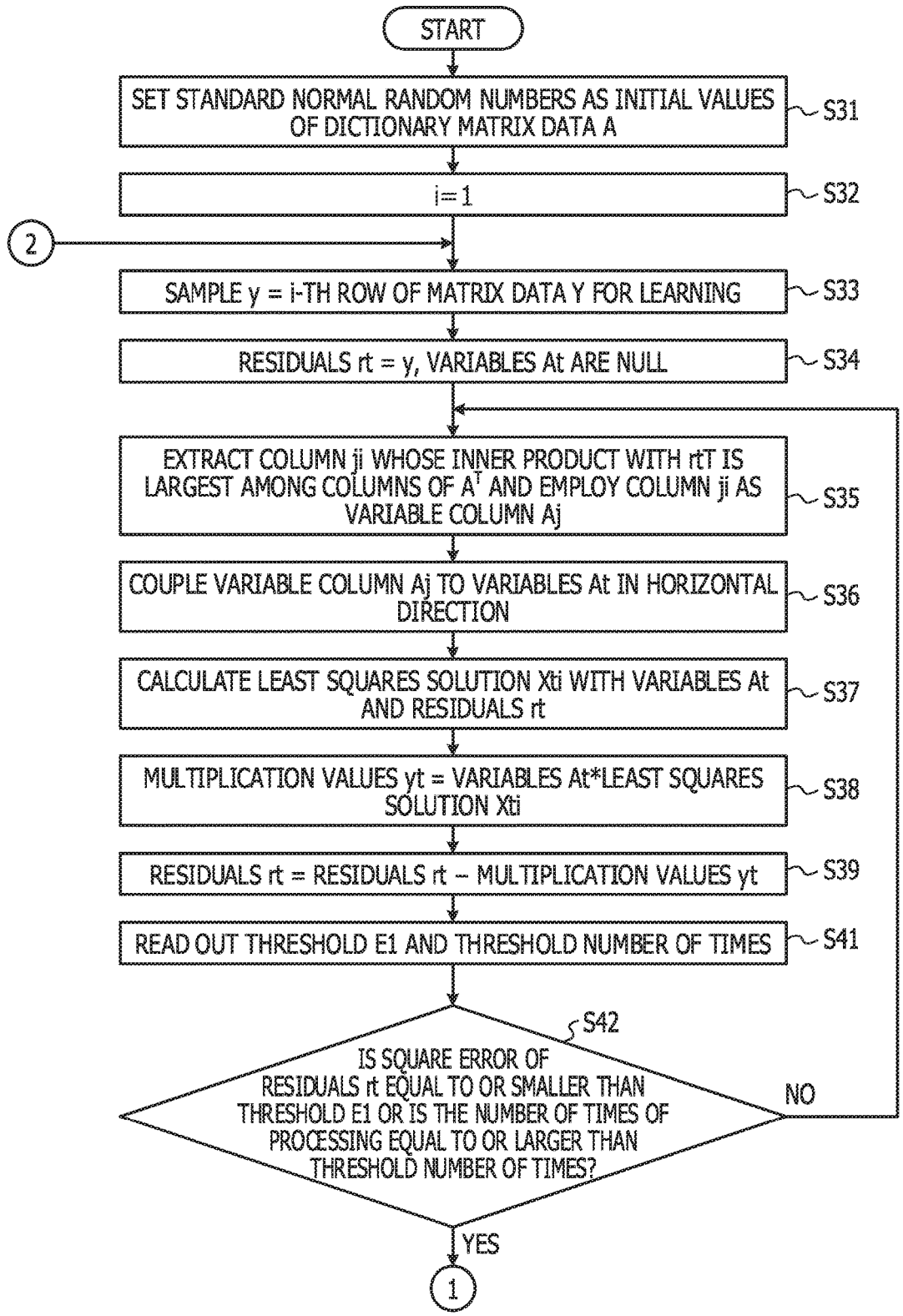
FIG. 3 is a flowchart illustrating a procedure of dictionary learning processing.
Figure 4:
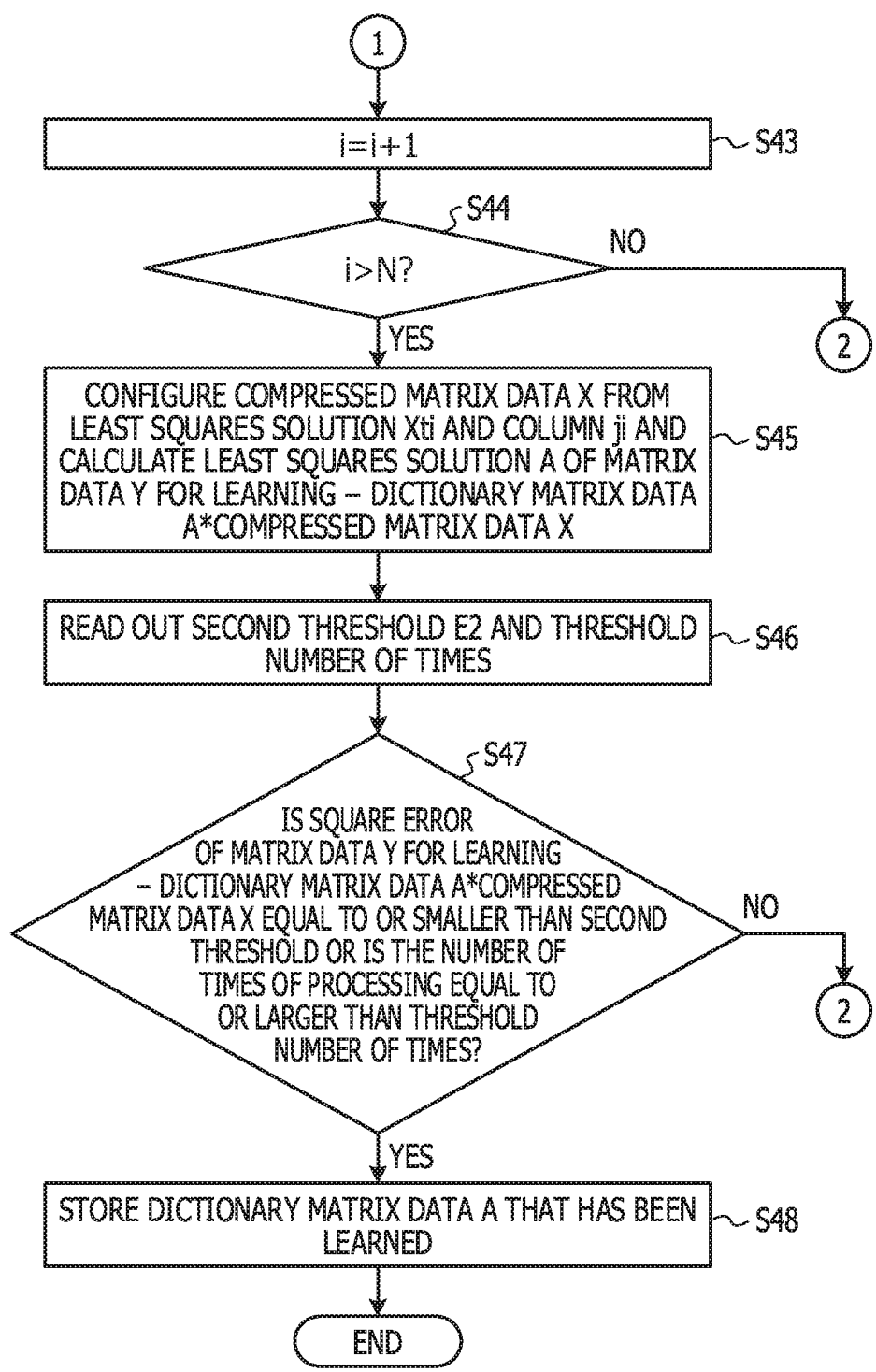
FIG. 4 is a flowchart illustrating a procedure of a dictionary learning processing.

FIG. 3 and FIG. 4 depict a flowchart illustrating a procedure of dictionary learning processing. The CPU 11 of the computer 1 sets standard normal random numbers as initial values of the dictionary matrix data A (S31). As inputs, the unit of compression (the number of elements) of data is defined as n, and the number of pieces of data for learning (the number of vectors of the unit of compression) is defined as N, and the matrix data $Y_A$ for learning (hereinafter, represented by Y depending on the case) is defined as a matrix of n rows and N columns. Furthermore, the dictionary matrix data A of n rows and m columns is employed as an output. The compressed matrix data X of m rows and N columns, residuals rt (residual vector rt), variables At, a loop variable i, and so forth are defined as variables.

The CPU 11 inputs 1 as the variable i (S32). The CPU 11 inputs data of the i-th column of the matrix data Y for learning as a sample y (S33). The CPU 11 inputs the sample y as initial values of the residuals rt and inputs NULL as initial values of the variables At (S34).

FIG. 5 is an explanatory diagram illustrating a numerical value example of residuals and variables. FIG. 6 is an explanatory diagram illustrating a numerical value example of a dictionary matrix data. As illustrated in FIG. 5, as the residuals rt, the data of the i-th column of the matrix data Y for learning, 2.6, 2.6, 2.6, 2.4, . . . , is input. In the examples of FIG. 5 and FIG. 6, the length of the vector is defined as 100. However, for convenience of the plane of paper, the range to the 20th element is represented in FIG. 5 and FIG. 6.

The CPU 11 extracts a column ji (position information) whose inner product with a transposed matrix $rt^T$ of the residuals rt is the largest among the columns of a transposed matrix $A^T$ of the dictionary matrix data A illustrated in FIG. 6 and employs the column ji as a variable column Aj (S35). For example, the CPU 11 deems the column that provides the largest inner product as the vector oriented in the most similar direction and extracts the column. The CPU 11 couples the variable column Aj to the variables At in the horizontal direction (S36). At the first round, the initial values of At are NULL and therefore the variable column Aj of the coupling target is input as it is. As illustrated in FIG. 5 and FIG. 6, the first column of the variables At is similar to the 13th column of the dictionary matrix data A in the orientation of the vector and the second column of the variables At is similar to the 292nd column of the dictionary matrix data A in the orientation of the vector. Furthermore, the third column of the variables At is similar to the 169th column of the dictionary matrix data A in the orientation of the vector.

The CPU 11 calculates a least squares solution Xti with the variables At and the residuals rt (S37). For example, the CPU 11 calculates Xti that provides the smallest square error of rt−At*Xti among Xti that satisfies rt=At*Xti. As represented in FIG. 5, Xti is calculated as 7.509095, 6.965821, 5.834313, . . . . The CPU 11 multiplies the variables At by the least squares solution Xti to calculate multiplication values yt (S38). The CPU 11 replaces the residuals rt by the values obtained by subtracting the multiplication values yt from the residuals rt (S39). In FIG. 5, rt are replaced by 1.618316731, 3.323110212, . . . .

The CPU 11 reads out a threshold E1 and a threshold number of times (for example, 30 times) from the storing unit 15 (S41). The CPU 11 determines whether or not the square error of the residuals rt is equal to or smaller than the threshold E1 or the number of times of processing of S35 to S41 is equal to or larger than the threshold number of times (S42). If determining that the square error of the residuals rt is not equal to or smaller than the threshold E1 and the number of times of processing is not equal to or larger than the threshold number of times (NO in S42), the CPU 11 makes a transition of the processing to S35. In the transition to S35, the CPU 11 increments the number of times the processing of S35 to S41 has been executed and stores the number of times in the RAM 12. The CPU 11 compares the threshold number of times and the number of times stored in the RAM 12 in S42.

If determining that the square error of the residuals rt is equal to or smaller than the threshold E1 or the number of times of processing is equal to or larger than the threshold number of times (YES in S42), the CPU 11 makes a transition of the processing to S43. The CPU 11 adds 1 to the variable i (S43). The CPU 11 determines whether or not the variable i is larger than N (S44). If determining that the variable i is not larger than N (NO in S44), the CPU 11 returns the processing to S33. On the other hand, if determining that the variable i is larger than N (YES in S44), the CPU 11 makes a transition of the processing to S45.

The CPU 11 configures the compressed matrix data X from the least squares solution Xti and the column ji and calculates a least squares solution A of matrix data Y for learning−dictionary matrix data A*compressed matrix data X (S45). For example, because Xti is composed of only non-zero components, the CPU 11 uses the column numbers ji obtained in S35 (in the example of FIG. 5, 13, 292, 169, . . . ) and sets element values at positions other than the positions of the non-zero components (13, 292, 169, . . . ) to configure the compressed matrix data X. Subsequently, the CPU 11 obtains the least squares solution of Y=A*X and employs the least squares solution as new A.

The CPU 11 reads out a second threshold E2 and a threshold number of times from the storing unit 15 (S46). The CPU 11 determines whether or not the square error of matrix data Y for learning−dictionary matrix data A*compressed matrix data X is equal to or smaller than the second threshold E2 or the number of times of processing is equal to or larger than the threshold number of times (S47). For example, the CPU 11 determines whether or not the square error of Y=AX is equal to or smaller than the second threshold E2. Furthermore, the CPU 11 determines whether or not the number of times the processing of S47 has been executed is equal to or larger than the threshold number of times. If determining that the square error is not equal to or smaller than the second threshold E2 and the number of times of processing is not equal to or larger than the threshold number of times (NO in S47), the CPU 11 returns the processing to S33. After the processing of S47, the CPU 11 increments the number of times the processing of S47 has been executed and stores the number of times in the RAM 12. The CPU 11 compares the threshold number of times and the number of times stored in the RAM 12 in the processing of S47.

If determining that the square error is equal to or smaller than the second threshold E2 or the number of times of processing is equal to or larger than the threshold number of times (YES of S47), the CPU 11 makes a transition of the processing to S48. The CPU 11 stores the dictionary matrix data A that has been learned in the storing unit 15 (S48).

Figure 7:
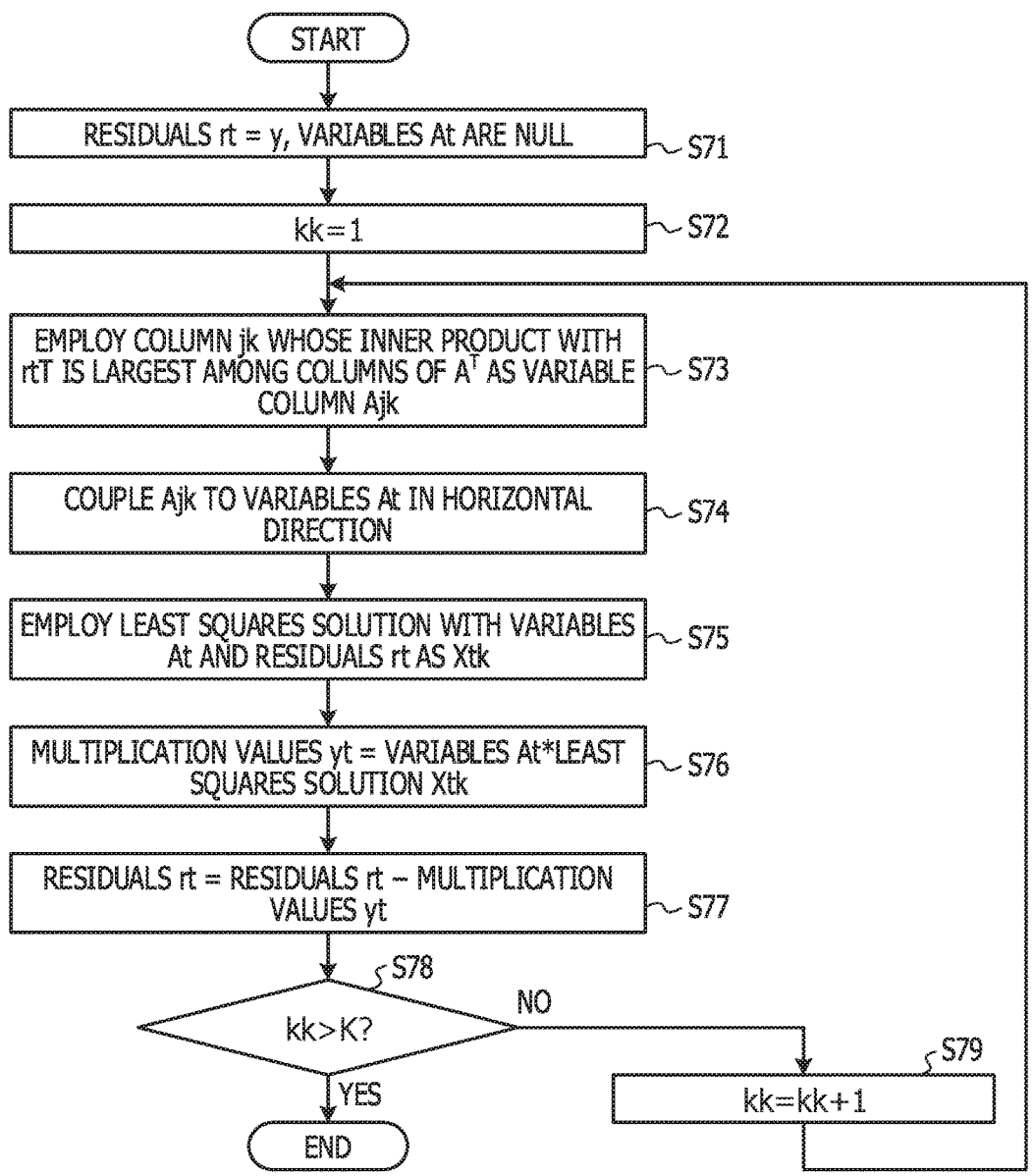
FIG. 7 is a flowchart illustrating a procedure of compression processing.

FIG. 7 is a flowchart illustrating a procedure of compression processing. Data y of a compression target as an input is a column vector about which the unit of compression (the number of elements) is n. Besides, the number K of non-zero elements of the compressed matrix data X and the dictionary matrix data A (matrix of n rows and m columns) are employed as inputs. Furthermore, a compression result Xtk and a position jk (position information) of a non-zero element are employed as outputs. The residuals rt and the variables At (dictionary) are employed as internal variables. The CPU 11 inputs the data y as initial values of the residuals rt and inputs NULL as initial values of the variables At (S71). The CPU 11 inputs 1 as a variable kk (S72).

The CPU 11 extracts a column jk (position information) whose inner product with the transposed matrix $rt^T$ of the residuals rt is the largest among the columns of the transposed matrix $A^T$ of the dictionary matrix data A and employs the column jk as a variable column Ajk (S73). For example, the CPU 11 extracts the column jk whose inner product with $rt^T$ is the largest among the columns of $A^T$ and employs the column jk as Ajk. The CPU 11 couples the variable column Ajk to the variables At in the horizontal direction (S74). The CPU 11 employs the least squares solution with the variables At and the residuals rt as Xtk (S75).

The CPU 11 multiplies the variables At by the least squares solution Xtk to calculate multiplication values yt (S76). The CPU 11 replaces the residuals rt by the values obtained by subtracting the multiplication values yt from the residuals rt (S77). The CPU 11 determines whether or not the variable kk is larger than the number K of non-zero elements (S78). If determining that the variable kk is not larger than the number K (NO in S78), the CPU 11 makes a transition of the processing to S79. The CPU 11 increments the value of the variable kk (S79). Thereafter, the CPU 11 makes a transition of the processing to S73. If determining that the variable kk is larger than the number K (YES in S78), the CPU 11 ends the processing. The CPU 11 outputs Xtk obtained in S76 and the positions jk (k=1 to K) (position information) of the non-zero elements obtained in S73.

Figure 8:
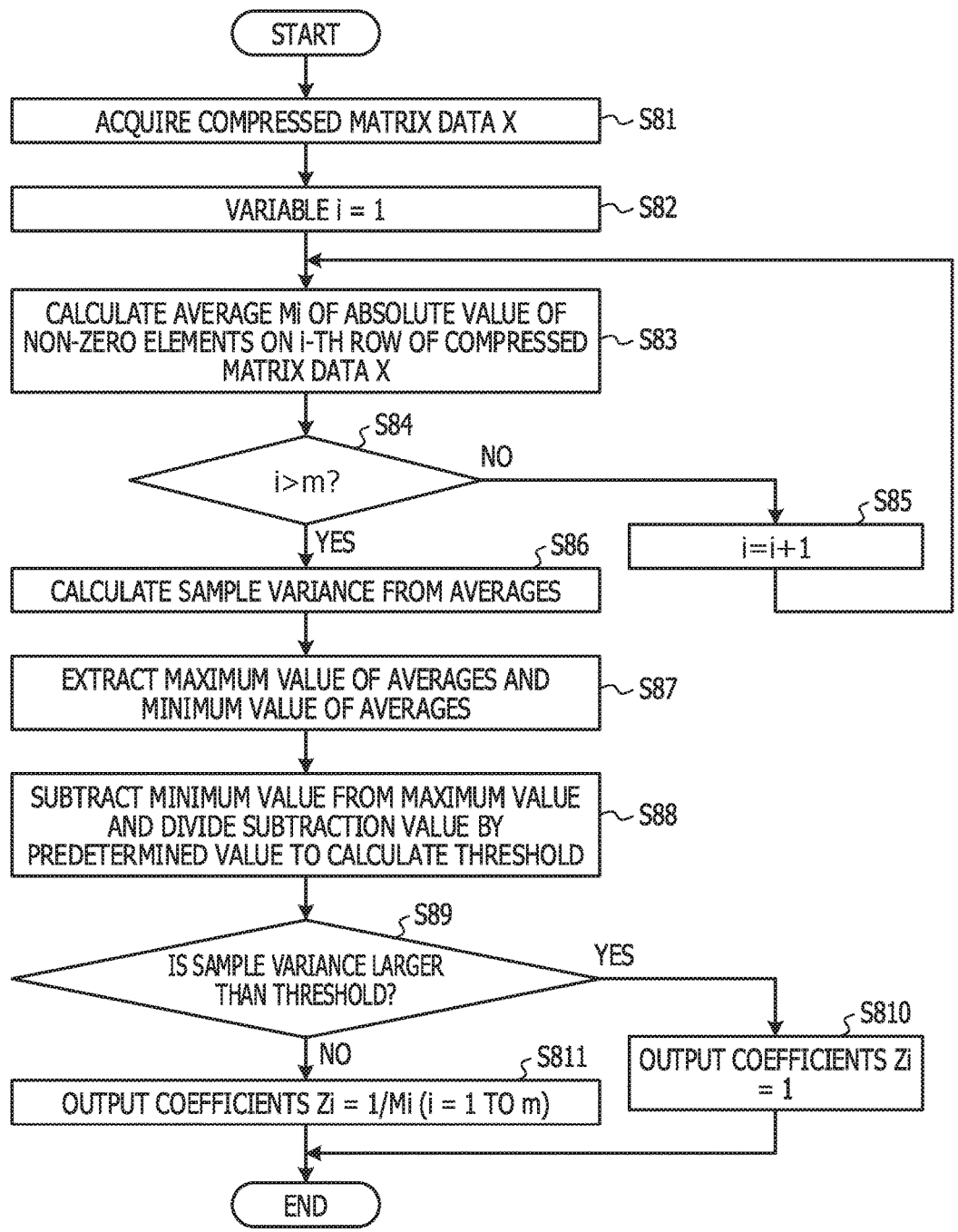
FIG. 8 is a flowchart illustrating a procedure of coefficient calculation processing.

FIG. 8 is a flowchart illustrating a procedure of coefficient calculation processing. The CPU 11 acquires the compressed matrix data X (S81). FIG. 9 is an explanatory diagram illustrating a data example of compressed matrix data. The compressed matrix data X is a matrix of m rows and N columns, and the row corresponds to the position of the element of the compression result and the column corresponds to the sequence of the sample. Most of the row data is 0 and plural non-zero elements exist. The CPU 11 inputs an initial value 1 as the variable i (S82).

The CPU 11 acquires a specific value of the non-zero elements on the i-th row of the compressed matrix data X. The specific value is a value specified based on the non-zero elements on the i-th row and is an average, median, maximum value, minimum value, mean square, or the like of the plural non-zero elements, for example. Although an example in which the specific value based on non-zero elements is used is represented in the embodiment, a form in which zero elements are partly included may be employed. In the following embodiment, the description will be made based on the assumption that the specific value is the average of the absolute value of non-zero elements. The CPU 11 calculates an average Mi of the absolute value of the non-zero elements on the i-th row of the compressed matrix data X (S83). The CPU 11 determines whether or not the variable i is larger than m (the number m of rows) (S84). If determining that the variable i is not larger than m (NO in S84), the CPU 11 makes a transition of the processing to S85.

The CPU 11 adds 1 to i (S85). Thereafter, the CPU 11 returns the processing to S83. Thereby, a specific value data string (Mi (i=1 to m)) that is a data string obtained by coupling the averages is calculated. If determining that i is larger than m (YES in S84), the CPU 11 makes a transition of the processing to S86. The CPU 11 calculates an index value that represents the degree of variation in the average based on the plural calculated averages. Although the description will be made based on the assumption that the index value is a sample variance in the embodiment, the index value is not limited thereto. For example, an unbiased variance may be used.

The CPU 11 calculates the sample variance of the averages of the respective rows (S86). The CPU 11 extracts the maximum value and the minimum value of the averages (S87). The CPU 11 subtracts the minimum value from the maximum value to obtain the subtraction value, and divides the subtraction value by a given value (for example, 6) to calculate a threshold (TX) (S88). For the given value, a user may set a value from the input unit 13 as appropriate. The CPU 11 determines whether or not the sample variance is larger than the threshold (S89). If determining that the sample variance is larger than the threshold (YES in S89), the CPU 11 makes a transition of the processing to S810. Because the variation is large, the CPU 11 outputs coefficients Zi as 1 (S810).

If the sample variance is not larger than the threshold (NO in S89), the CPU 11 makes a transition of the processing to S811. The CPU 11 outputs the coefficients Zi as the reciprocals of the averages Mi (Zi=1/Mi (i=1 to m)) (S811).

FIG. 10 is an explanatory diagram illustrating a data example of coefficients. Y1 and Y2 represent compression-target matrix data before compression. X1 and X2 are the compressed matrix data X after compression processing based on the dictionary matrix data A. Here, the number of non-zero elements of the compressed matrix data X is K=8. As coefficients Z, the reciprocals of the averages of the absolute values of X1 and X2 are employed for easy explanation. Furthermore, it is assumed that the sample variance of the coefficients Z is 4.1 and is not larger than the threshold. Subsequently, the CPU 11 executes correction processing of the compressed matrix data X by use of the coefficients Z and fraction processing (rounding processing).

Figure 11:
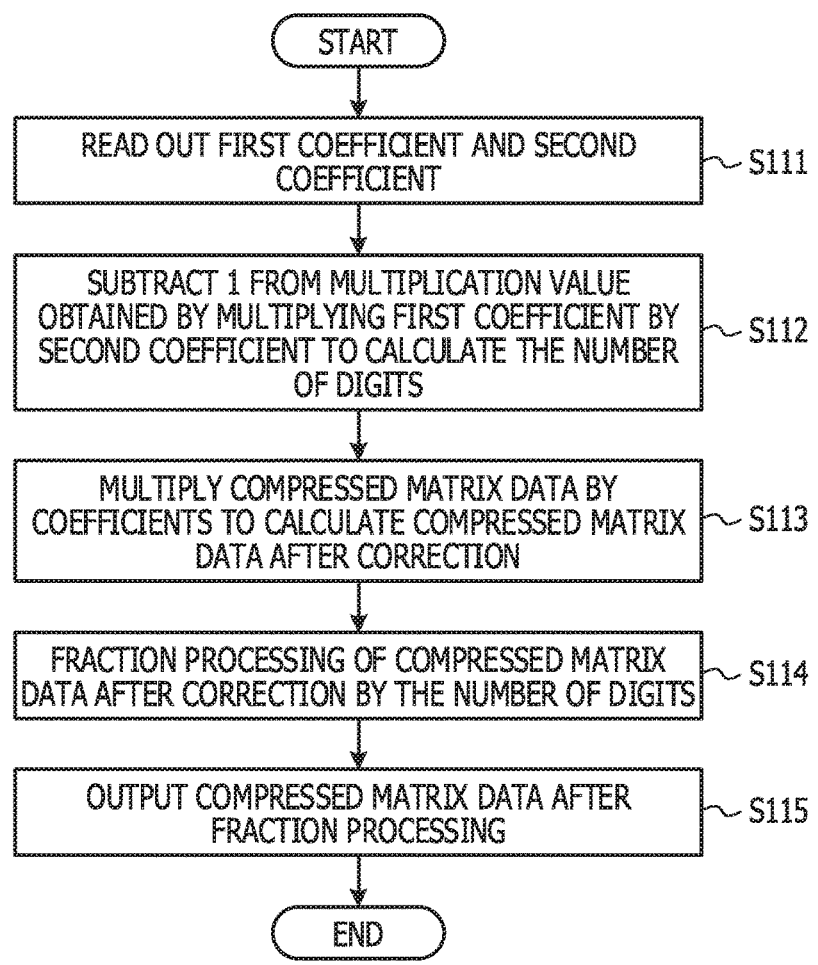
FIG. 11 is a flowchart illustrating a procedure of correction processing and fraction processing.

FIG. 11 is a flowchart illustrating a procedure of correction processing and fraction processing. FIG. 12 and FIG. 13 are explanatory diagrams illustrating numerical value examples. The CPU 11 reads out a first coefficient and a second coefficient stored in the storing unit 15 (S111). The first coefficient represents the volume ratio between the compression-target matrix data Y and the compressed matrix data X. For example, the first coefficient may be the value obtained by dividing the number of significant digits (the number of places of significant figures) of the decimal part of the compressed matrix data X by the number of significant digits after the decimal point of the compression-target matrix data Y. Although the number of significant digits of the decimal part is used in the present embodiment, the first coefficient is not limited thereto. The number of significant digits of the compressed matrix data X may be employed as the first coefficient. Furthermore, the value obtained by dividing the number of characters including the decimal point of the compressed matrix data X by the number of characters including the decimal point of the compression-target matrix data Y may be employed as the first coefficient. For example, in the case of 2.6, the number of characters is 3 including the decimal point. In the embodiment, the description will be made based on the assumption that the first coefficient is 2 as one example.

The second coefficient is the number of significant digits of the compression-target matrix data Y in the present embodiment, and the description will be made based on the assumption that the second coefficient is 2 as one example. The CPU 11 subtracts 1 from a multiplication value obtained by multiplying the first coefficient by the second coefficient to calculate the number of digits (S112). In the present embodiment, the first coefficient 2 is multiplied by the second coefficient 2 to obtain the multiplication value 4 and 1 is subtracted therefrom, so that the number of digits becomes 3. The CPU 11 multiplies the compressed matrix data X by the coefficients Z to calculate compressed matrix data Xtemp after correction (S113). In FIG. 12, the compressed matrix data Xtemp after correction resulting from the multiplication by the coefficients Z is represented.

The CPU 11 executes the fraction processing of the compressed matrix data Xtemp after correction by the number of digits obtained in S112 (S114). As represented in FIG. 13, the fraction processing is executed regarding the value of the third decimal place. As the fraction processing, rounding-off based on the numerical value of the fourth decimal place after the third decimal place, rounding-down of the numerical value of the fourth decimal place, or rounding-up to the third decimal place may be carried out. In the present embodiment, an example in which rounding-off is carried out is represented. The CPU 11 stores compressed matrix data X' after fraction processing in the storing unit 15 and outputs it to the display unit 14 or outputs it to the external through the communication unit 16 (S115). This makes it possible to efficiently compress data. Furthermore, it becomes possible to improve the accuracy due to the learning of the dictionary. Moreover, due to the calculation of the number of digits, precise compression into a size according to a request becomes possible. In addition, by setting the coefficients as appropriate according to the degree of variation of the compressed matrix data X, efficient compression becomes possible.

Embodiment 2

Figure 14:
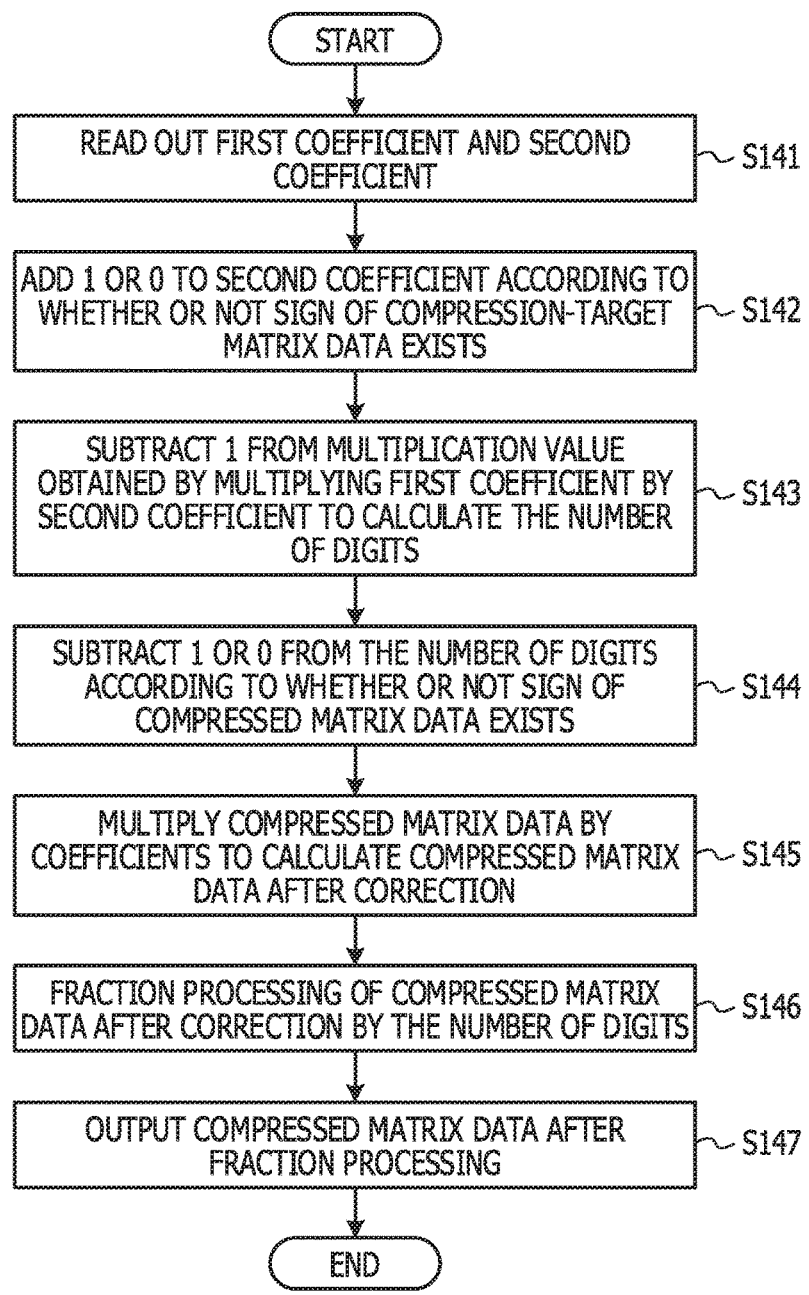
FIG. 14 is a flowchart illustrating a procedure of correction processing and fraction processing.

Embodiment 2 relates to a form in which the sign is taken into consideration. FIG. 14 is a flowchart illustrating a procedure of correction processing and fraction processing. FIG. 15 is an explanatory diagram illustrating a numerical value example. The CPU 11 reads out the first coefficient and the second coefficient stored in the storing unit 15 (S141). The description will be made based on the assumption that the first coefficient is 2 and the second coefficient is 2. The CPU 11 adds 1 or 0 to the second coefficient according to whether or not the sign of the compression-target matrix data Y exists (S142). Because the minus sign does not exist in the compression-target matrix data Y as represented in FIG. 12, addition is not carried out and the second coefficient remains 2.

The CPU 11 subtracts 1 from a multiplication value obtained by multiplying the first coefficient by the second coefficient to calculate the number of digits (S143). In the present embodiment, the first coefficient 2 is multiplied by the second coefficient 2 to obtain the multiplication value 4 and 1 is subtracted therefrom, so that the number of digits becomes 3. The CPU 11 subtracts 1 or 0 from the number of digits according to whether or not the sign of the compressed matrix data X exists (S144). Because the compressed matrix data X has the sign as represented in FIG. 12, 1 is subtracted from the number of digits 3 to figure out the number of digits 2. The CPU 11 multiplies the compressed matrix data X by the coefficients Z to calculate the compressed matrix data Xtemp after correction (S145).

The CPU 11 executes the fraction processing of the compressed matrix data Xtemp after correction by the number of digits obtained through the processing of S144 (S146). As represented in FIG. 15, the fraction processing is executed regarding the value of the second decimal place. In the present embodiment, an example in which rounding-off is carried out is represented. The CPU 11 stores compressed matrix data X' (compression result) after fraction processing in the storing unit 15 and outputs it to the display unit 14 or outputs it to the external through the communication unit 16 (S147). This allows accurate data compression in which whether or not the sign of the compressed matrix data X exists is also taken into consideration.

The present embodiment 2 is as above and the other configuration is similar to embodiment 1. Therefore, the corresponding part is given the same reference numeral and detailed description thereof is omitted.

Embodiment 3

Figure 16:
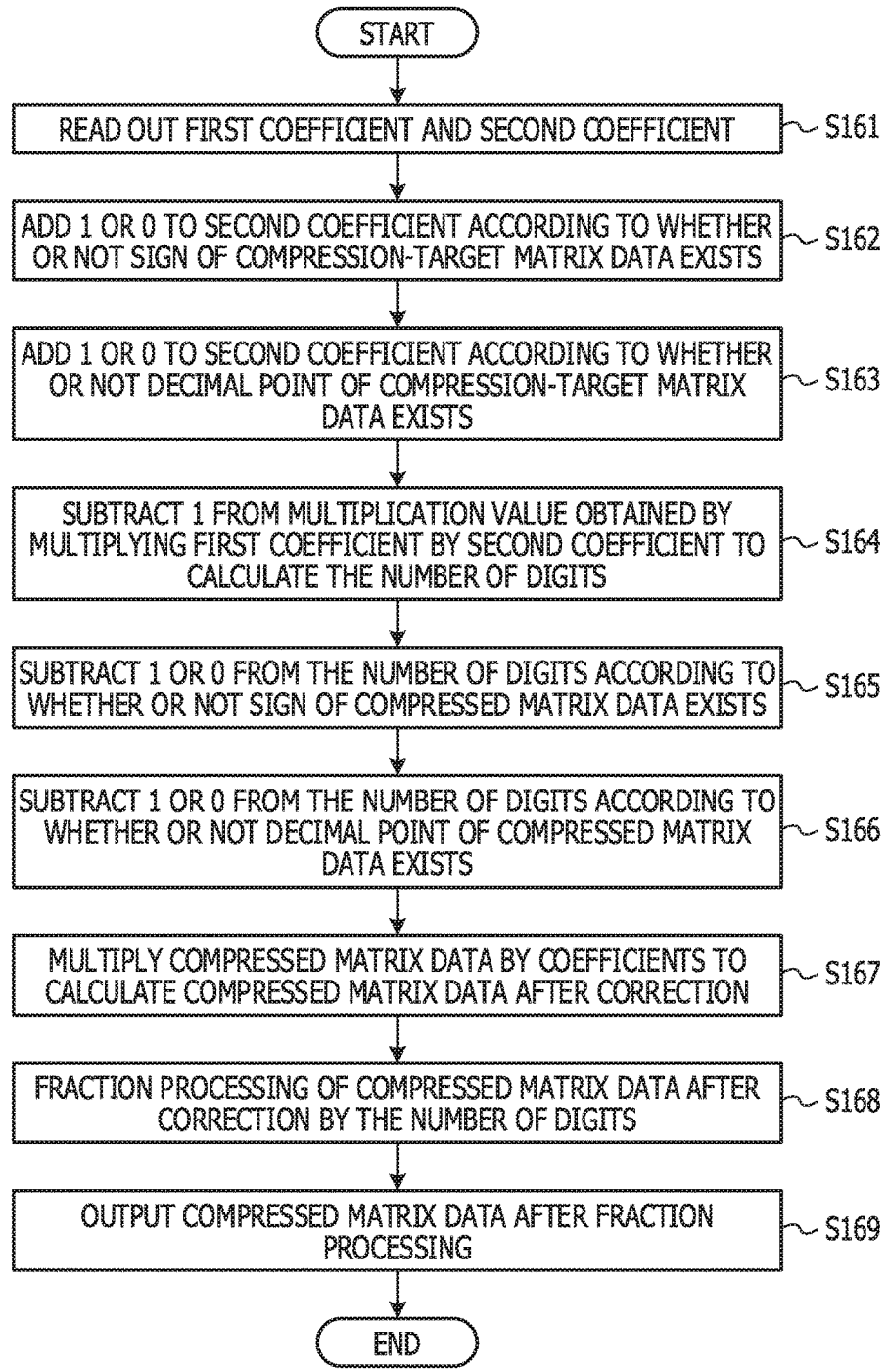
FIG. 16 is a flowchart illustrating a procedure of correction processing and fraction processing.

Embodiment 3 relates to a form in which whether or not the decimal point exists is also taken into consideration. FIG. 16 is a flowchart illustrating the procedure of correction processing and fraction processing. FIG. 17 is an explanatory diagram illustrating a numerical value example. The CPU 11 reads out the first coefficient and the second coefficient stored in the storing unit 15 (S161). The description will be made based on the assumption that the first coefficient is 2 and the second coefficient is 2. The CPU 11 adds 1 or 0 to the second coefficient according to whether or not the sign of the compression-target matrix data Y exists (S162). Because the minus sign does not exist in the compression-target matrix data Y as represented in FIG. 12, addition is not carried out and the second coefficient remains 2.

The CPU 11 adds 1 or 0 to the second coefficient according to whether or not the decimal point of the compression-target matrix data Y exists (S163). Because the decimal point exists in the compression-target matrix data Y as represented in FIG. 12, 1 is added and the second coefficient becomes 3. The CPU 11 subtracts 1 from a multiplication value obtained by multiplying the first coefficient by the second coefficient to calculate the number of digits (S164). In the present embodiment, the first coefficient 2 is multiplied by the second coefficient 3 to obtain the multiplication value 6 and 1 is subtracted therefrom, so that the number of digits becomes 5. The CPU 11 subtracts 1 or 0 from the number of digits according to whether or not the sign of the compressed matrix data X exists (S165). Because the compressed matrix data X has the sign as represented in FIG. 12, 1 is subtracted from the number of digits 5 to figure out the number of digits 4.

The CPU 11 subtracts 1 or 0 from the number of digits according to whether or not the decimal point of the compressed matrix data X exists (S166). Because the compressed matrix data X has the decimal point as represented in FIG. 12, 1 is subtracted from the number of digits 4 to figure out the number of digits 3. The CPU 11 multiplies the compressed matrix data X by the coefficients Z to calculate the compressed matrix data Xtemp after correction (S167). The CPU 11 executes the fraction processing of the compressed matrix data Xtemp after correction by the number of digits obtained through the processing of S166 (S168). As represented in FIG. 17, the fraction processing is executed regarding the value of the third decimal place. In the present embodiment, an example in which rounding-off is carried out is represented. The CPU 11 stores compressed matrix data X' after fraction processing in the storing unit 15 and outputs it to the display unit 14 or outputs it to the external through the communication unit 16 (S169). This allows accurate data compression in which whether or not the decimal point exists is also taken into consideration.

Figure 18:
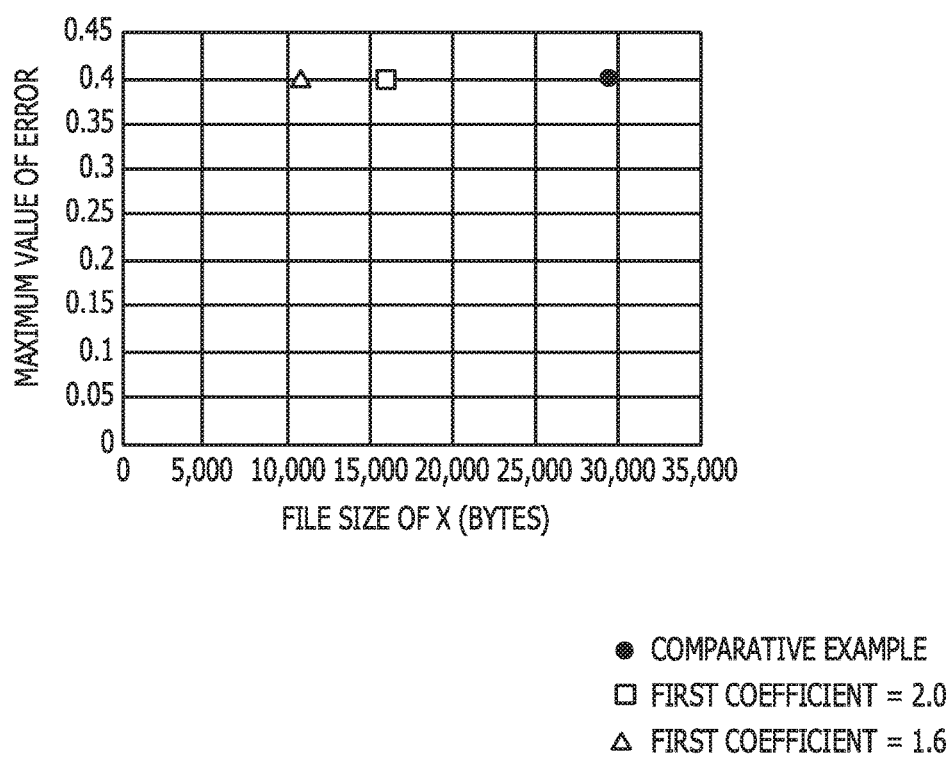
FIG. 18 is a graph illustrating a relationship between an error and a file size in a case of K=2.
Figure 19:
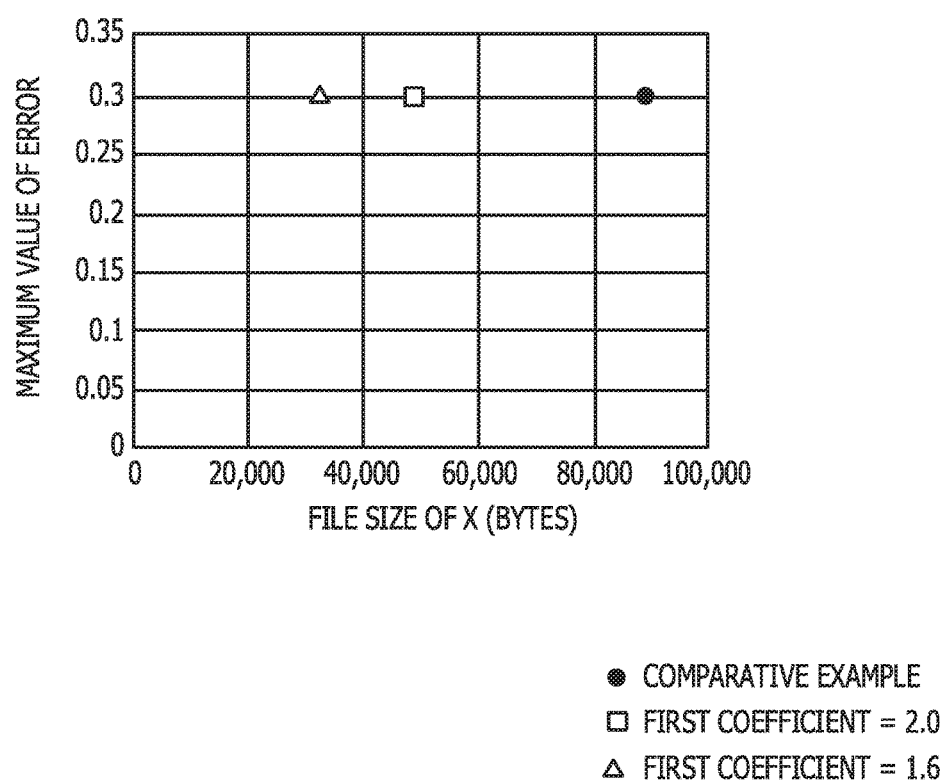
FIG. 19 is a graph illustrating a relationship between an error and a file size in a case of K=5.

FIG. 18 is a graph illustrating a relationship between an error and a file size in a case of K=2, and FIG. 19 is a graph illustrating a relationship between an error and a file size in a case of K=5. The abscissa axis in FIG. 18 is the file size (bytes) of the compressed matrix data X and the ordinate axis is the maximum value of the compression error. The file size of the compression-target matrix data Y is 963,000 bytes and the decimal point exists and the sign does not exist. The number of significant digits is 2 and the unit of compression of the compression-target matrix data Y is n=223. The case in which the number K of non-zero elements of the compressed matrix data X is 2 is FIG. 18 and the case in which the number K is 5 is FIG. 19. The series represented by the circle mark is a comparative example and is a series in which fraction processing is not executed. The series represented by the squares is a series in which the first coefficient is set to 2.0 and the series represented by the triangles is a series in which the first coefficient is set to 1.6.

The file size after compression is substantially file size before compression*first coefficient*K/n. Furthermore, it may be understood that, by executing the fraction processing, data may be further compressed without enlarging the error when a text file is saved. In both cases of K=2 and K=5, substantially same level of compression error is obtained. Compression of approximately ½ with respect to the comparative example may be carried out in the case of the first coefficient 2.0 and compression of approximately ⅓ with respect to the comparative example may be carried out in the case of the first coefficient 1.6.

The present embodiment 3 is as above and the other configuration is similar to embodiment 1 or 2. Therefore, the corresponding part is given the same reference numeral and detailed description thereof is omitted.

Embodiment 4

Figure 20:
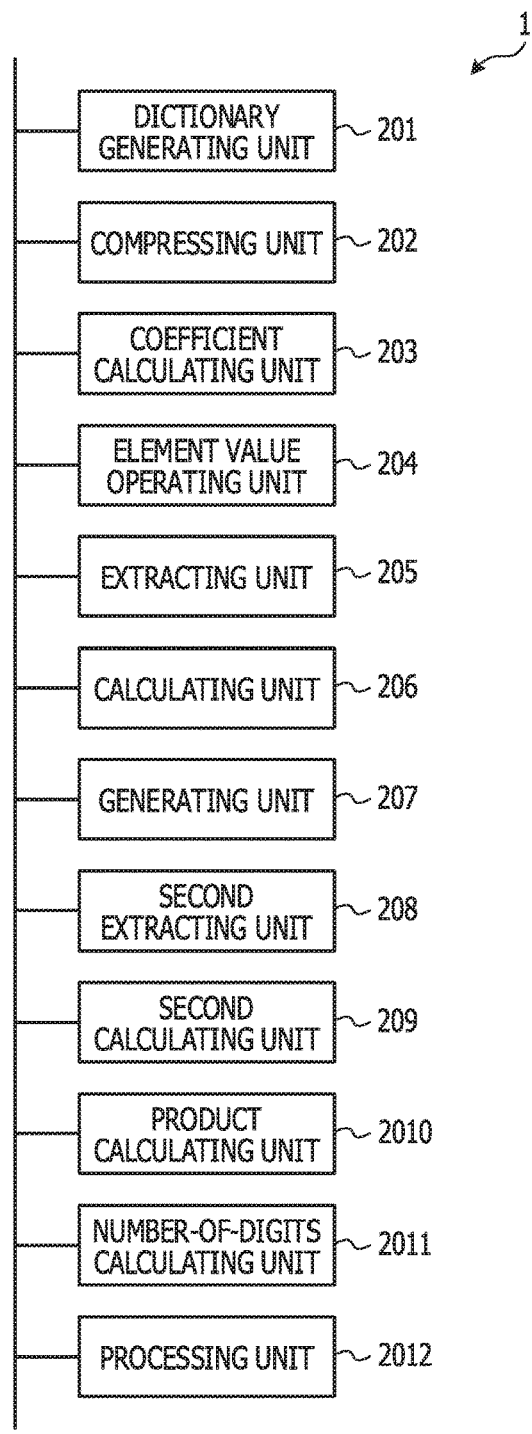
FIG. 20 is a functional block diagram that represents operation of a computer with the above-described form.

FIG. 20 is a functional block diagram that represents operation of the computer 1 with the above-described form.

The CPU 11 executes the control program 15P and thereby the computer 1 operates as follows. A dictionary generating unit 201 generates dictionary matrix data used for compression based on input matrix data for learning. A compressing unit 202 generates compressed matrix data that is the result of compression of input compression-target matrix data and information on the positions at which matrix elements are not zero among the respective matrix elements of the compressed matrix data based on the compression-target matrix data and the dictionary matrix data generated. A coefficient calculating unit 203 compares a threshold and an index value calculated about a specific value data string that is a data string obtained by coupling specific values specified from element values that are not zero values in each row of the compressed matrix data generated. The coefficient calculating unit 203 specifies a given constant as the respective coefficients if the index value is larger than the threshold, and calculates the reciprocals of the respective specific values as the respective coefficients if the index value is equal to or smaller than the threshold.

An element value operating unit 204 outputs, as a compression result, matrix data after operation that is the result of rounding based on the number of places of significant figures of the decimal part in each element that corresponds about the products of the respective elements of the compressed matrix data and the respective coefficients calculated, regarding the respective elements of the compressed matrix data. An extracting unit 205 extracts column data of the dictionary matrix data that provides the largest inner product with column data of the matrix data for learning and position information based on the column data of the matrix data for learning. A calculating unit 206 calculates a least squares solution based on the column data extracted and the column data of the matrix data for learning. A generating unit 207 generates the dictionary matrix data based on the calculated least squares solution, the position information, and the matrix data for learning.

A second extracting unit 208 extracts column data of the dictionary matrix data that provides the largest inner product with column data of the compression-target matrix data based on the column data of the compression-target matrix data. A second calculating unit 209 calculates a least squares solution based on the column data extracted and the column data of the compression-target matrix data. A product calculating unit 2010 calculates the products of the respective elements of the compressed matrix data and the respective coefficients. A number-of-digits calculating unit 2011 calculates the number of digits calculated based on a first coefficient, a second coefficient obtained based on the number of significant digits of the compression-target matrix data and whether or not the sign of the compression-target matrix data exists, and whether or not the sign of the respective elements of the compressed matrix data exists. A processing unit 2012 processes the fractions of the products calculated by the product calculating unit 2010 based on the number of digits calculated by the number-of-digits calculating unit 2011.

Figure 21:
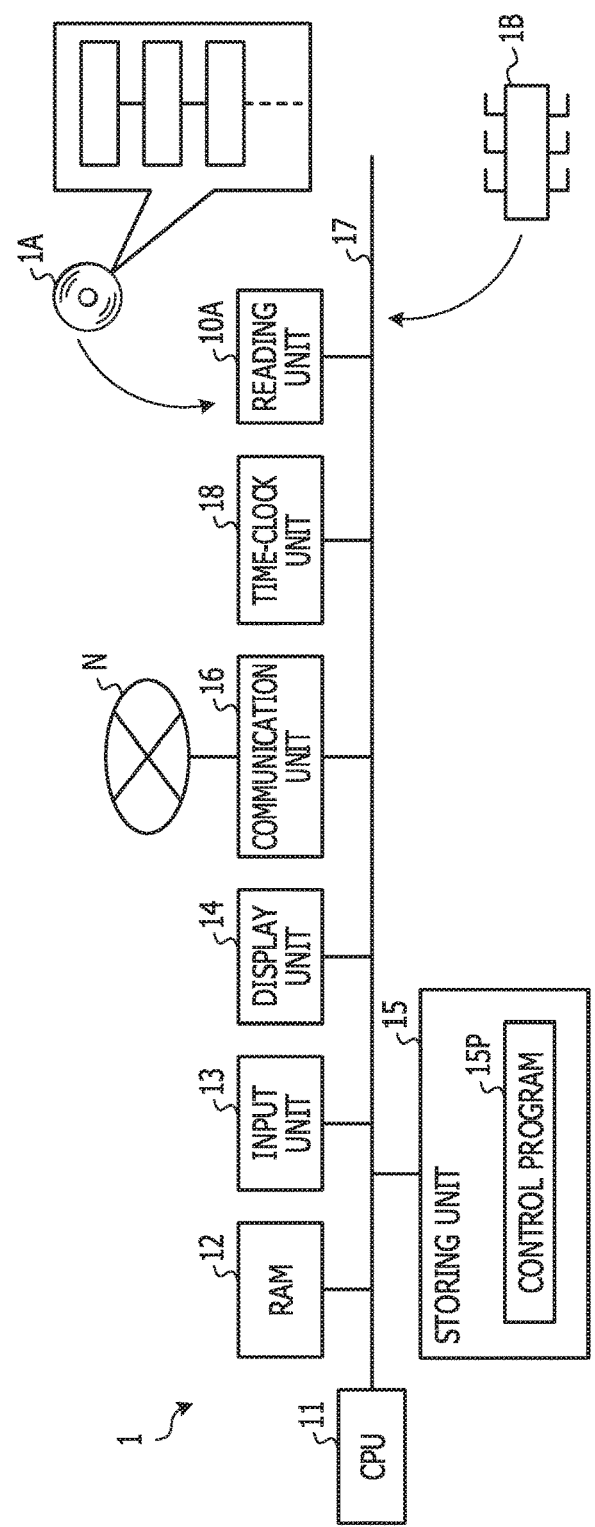
FIG. 21 is a block diagram illustrating a hardware group of a computer according to embodiment 4.

FIG. 21 is a block diagram illustrating a hardware group of the computer 1 according to embodiment 4. A program for operating the computer 1 may be stored in the storing unit 15 through causing a reading unit 10A such as a disc drive or memory card slot to read a portable recording medium 1A such as a compact disc-read-only memory (CD-ROM), digital versatile disc (DVD) disc, memory card, or universal serial bus (USB) memory. Furthermore, a semiconductor memory 1B such as a flash memory that stores this program may be mounted in the computer 1. Moreover, it is also possible to download this program from another server computer (not illustrated) coupled through a communication network N such as the Internet. Details thereof will be described below.

The computer 1 illustrated in FIG. 21 reads the program that executes the above-described various kinds of software processing from the portable recording medium 1A or the semiconductor memory 1B or downloads the program from another server computer (not illustrated) through the communication network N. This program is installed as the control program 15P and is loaded into the RAM 12 to be executed. This allows functioning as the above-described computer 1. Besides, a hardware device including a memory that stores the program to execute the above-described processing and a processor may be implemented as a data compression apparatus in a server computer, personal computer, smartphone, or the like that is not illustrated.

The present embodiment 4 is as above and the other configuration is similar to embodiments 1 to 3. Therefore, the corresponding part is given the same reference numeral and detailed description thereof is omitted. The respective embodiments described above may be combined as appropriate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A data compression apparatus, comprising:
   a memory; and
   a processor coupled to the memory and configured to:
      generate dictionary matrix data used for compression based on matrix data for learning,
      generate compressed matrix data that is a result of compression of compression-target matrix data and information on positions at which matrix elements are not zero among respective matrix elements of the compressed matrix data based on the compression-target matrix data and the generated dictionary matrix data,
      compare a threshold and an index value calculated about a specific value data string that is a data string obtained by coupling specific values specified from element values that are not zero values in each row of the generated compressed matrix data,
      specify a given constant as respective coefficients when the index value is larger than the threshold,
      calculate reciprocals of respective specific values as the respective coefficients when the index value is equal to or smaller than the threshold, and
      output, as a compression result, matrix data after operation that is a result of rounding based on a number of places of significant figures of a decimal part in each element that corresponds about products of respective elements of the compressed matrix data and the respective coefficients, regarding the respective elements of the compressed matrix data.

2. The data compression apparatus according to claim 1, wherein the processor is configured to:
   extract column data of the dictionary matrix data that provides a largest inner product with column data of the matrix data for learning and position information based on the column data of the matrix data for learning,
   calculate a least squares solution based on the column data extracted and the column data of the matrix data for learning, and
   generate the dictionary matrix data based on the calculated least squares solution, the position information, and the matrix data for learning.

3. The data compression apparatus according to claim 1, wherein the processor is configured to:
   extract column data of the dictionary matrix data that provides a largest inner product with column data of the compression-target matrix data and position information based on the column data of the compression-target matrix data, and
   calculate a least squares solution based on the column data extracted and the column data of the compression-target matrix data.

4. The data compression apparatus according to claim 1, wherein the processor is configured to:
   calculate the products of the respective elements of the compressed matrix data and the respective coefficients,
   calculate the number of digits based on a first coefficient, a second coefficient obtained based on the number of significant digits of the compression-target matrix data and whether or not a sign of the compression-target matrix data exists, and whether or not a sign of the respective elements of the compressed matrix data exists, and
   process fractions of the calculated products based on the calculated number of digits.

5. The data compression apparatus according to claim 4, wherein the processor is configured to
   calculate the number of digits based on the first coefficient, the second coefficient obtained based on the number of significant digits of the compression-target matrix data, whether or not a sign of the compression-target matrix data exists, and whether or not a decimal point of the compression-target matrix data exists, and whether or not a sign of the respective elements of the compressed matrix data exists and whether or not a decimal point of the respective elements of the compressed matrix data exists.

6. The data compression apparatus according to claim 4, wherein the processor is configured to
   process the fractions after a digit place corresponding to the calculated number of digits for the calculated products.

7. The data compression apparatus according to claim 1, wherein the threshold is determined based on a maximum value and a minimum value of the specific values.

8. The data compression apparatus according to claim 1, wherein
   the specific value is an average, a median, a maximum value, or a mean square of the element values that are not zero values in each row of the generated compressed matrix data, and
   the index value is a variance of the specific value data string that is the data string obtained by coupling the specific values.

9. The data compression apparatus according to claim 1, wherein the index value represents a degree of variation of the specified specific values.

10. A non-transitory computer-readable storage medium storing a program that causes a computer to execute a process, the process comprising:
  generating dictionary matrix data used for compression based on matrix data for learning;
  generating compressed matrix data that is a result of compression of compression-target matrix data and information on positions at which matrix elements are not zero among respective matrix elements of the compressed matrix data based on the compression-target matrix data and the generated dictionary matrix data;
  comparing a threshold and an index value calculated about a specific value data string that is a data string obtained by coupling specific values specified from element values that are not zero values in each row of the generated compressed matrix data;
  specifying a given constant as respective coefficients when the index value is larger than the threshold;
  calculating reciprocals of respective specific values as the respective coefficients when the index value is equal to or smaller than the threshold; and
  outputting, as a compression result, matrix data after operation that is a result of rounding based on a number of places of significant figures of a decimal part in each element that corresponds about products of respective elements of the compressed matrix data and the respective coefficients, regarding the respective elements of the compressed matrix data.

11. A data compression method executed by a processor included in a data compression apparatus, the data compression method comprising:
  generating dictionary matrix data used for compression based on matrix data for learning;
  generating compressed matrix data that is a result of compression of compression-target matrix data and information on positions at which matrix elements are not zero among respective matrix elements of the compressed matrix data based on the compression-target matrix data and the generated dictionary matrix data;
  comparing a threshold and an index value calculated about a specific value data string that is a data string obtained by coupling specific values specified from element values that are not zero values in each row of the generated compressed matrix data;
  specifying a given constant as respective coefficients when the index value is larger than the threshold;
  calculating reciprocals of respective specific values as the respective coefficients when the index value is equal to or smaller than the threshold; and
  outputting, as a compression result, matrix data after operation that is a result of rounding based on a number of places of significant figures of a decimal part in each element that corresponds about products of respective elements of the compressed matrix data and the respective coefficients, regarding the respective elements of the compressed matrix data.

12. A non-transitory computer-readable storage medium storing a program that causes a computer to execute a process, the process comprising:
  acquiring compressed matrix data obtained based on compression-target matrix data and dictionary matrix data;
  acquiring a specific value based on each piece of row data of the acquired compressed matrix data;
  calculating an index value based on a plurality of the acquired specific values; and
  specifying coefficients to correct the compressed matrix data based on the calculated index value and a threshold.

13. The storage medium according to claim 11, wherein the process further comprises:
  multiplying the compressed matrix data by the coefficients to figure out multiplication values; and
  executing fraction processing of the multiplication values based on the number of significant digits of the compression-target matrix data.

* * * * *